(12) United States Patent
Higuchi et al.

(10) Patent No.: US 11,018,017 B2
(45) Date of Patent: May 25, 2021

(54) SUBSTRATE TREATMENT METHOD

(71) Applicant: SCREEN Holdings Co., Ltd., Kyoto (JP)

(72) Inventors: Ayumi Higuchi, Kyoto (JP); Akihisa Iwasaki, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 16/329,251

(22) PCT Filed: Sep. 20, 2017

(86) PCT No.: PCT/JP2017/033969
§ 371 (c)(1),
(2) Date: Feb. 28, 2019

(87) PCT Pub. No.: WO2018/056327
PCT Pub. Date: Mar. 29, 2018

(65) Prior Publication Data
US 2019/0189461 A1    Jun. 20, 2019

(30) Foreign Application Priority Data
Sep. 26, 2016    (JP) .............................. JP2016-187250

(51) Int. Cl.
*H01L 21/3105*    (2006.01)
*H01L 21/02*    (2006.01)
(Continued)

(52) U.S. Cl.
CPC ...... *H01L 21/3105* (2013.01); *H01L 21/0206* (2013.01); *H01L 21/02065* (2013.01);
(Continued)

(58) Field of Classification Search
CPC .............. H01L 21/3105; H01L 21/768; H01L 21/02065; H01L 21/67051; H01L 21/6715;
(Continued)

(56) References Cited

U.S. PATENT DOCUMENTS

2003/0119318 A1* 6/2003 Niuya ............... H01L 21/31133
                                                          438/690
2006/0079096 A1* 4/2006 Nakamori ......... H01L 21/31133
                                                          438/725

(Continued)

FOREIGN PATENT DOCUMENTS

JP        2001-110899 A      4/2001
JP        2002-353308 A      12/2002
(Continued)

OTHER PUBLICATIONS

International Search Report dated Nov. 7, 2017 in corresponding PCT International Application No. PCT/JP2017/033969.
(Continued)

*Primary Examiner* — Mohammad M Hoque
(74) *Attorney, Agent, or Firm* — Ostrolenk Faber LLP

(57) ABSTRACT

A substrate in which a low dielectric constant film is formed on a front surface thereof is processed. A densification step of densifying a surface layer portion of the low dielectric constant film to change to a densified layer is executed. Then, after a densified layer forming step, a repair liquid supplying step of supplying a repair liquid, for repairing the densified layer, to a front surface of the low dielectric constant film is executed.

7 Claims, 11 Drawing Sheets

(51) Int. Cl.
    *H01L 21/67*    (2006.01)
    *H01L 21/768*   (2006.01)
(52) U.S. Cl.
    CPC .... *H01L 21/6715* (2013.01); *H01L 21/67051* (2013.01); *H01L 21/768* (2013.01); *H01L 21/67167* (2013.01); *H01L 21/76825* (2013.01); *H01L 21/76826* (2013.01)
(58) Field of Classification Search
    CPC ........... H01L 21/0206; H01L 21/76825; H01L 21/76826; H01L 21/67167; H01L 21/31051; H01L 21/304; H01L 21/02052; H01L 21/02343; H01L 21/02307; H01L 2224/03921
    See application file for complete search history.

(56) References Cited

U.S. PATENT DOCUMENTS

| | | | |
|---|---|---|---|
| 2007/0077768 A1 | 4/2007 | Fujii et al. | 438/717 |
| 2007/0122752 A1 | 5/2007 | Asako et al. | 430/313 |
| 2009/0029558 A1* | 1/2009 | Chiba | H01J 37/3244 438/725 |
| 2009/0305480 A1* | 12/2009 | Sasahara | H01L 21/0206 438/422 |
| 2009/0311874 A1 | 12/2009 | Tomita et al. | 438/759 |
| 2010/0317185 A1* | 12/2010 | Vos | H01L 21/0206 438/591 |
| 2011/0053375 A1 | 3/2011 | Ishikawa et al. | 438/674 |
| 2011/0207319 A1* | 8/2011 | Imada | H01L 21/3105 438/653 |
| 2012/0187083 A1* | 7/2012 | Hashizume | H01L 21/3105 216/37 |
| 2013/0052828 A1 | 2/2013 | Hashizume et al. | 438/694 |
| 2015/0021775 A1* | 1/2015 | Matsumoto | C23C 16/401 257/751 |

FOREIGN PATENT DOCUMENTS

| | | |
|---|---|---|
| JP | 2005-340288 A | 12/2005 |
| JP | 2006-086411 A | 3/2006 |
| JP | 2007-123836 A | 5/2007 |
| JP | 2007-157768 A | 6/2007 |
| JP | 2008-010610 A | 1/2008 |
| JP | 2010-114414 A | 5/2010 |
| JP | 2013-051264 A | 3/2013 |
| JP | 5425404 B2 | 2/2014 |

OTHER PUBLICATIONS

Written Opinion dated Nov. 7, 2017 in corresponding PCT International Application No. PCT/JP2017/033969.
International Preliminary Report on Patentability (Chapter I) dated Apr. 4, 2019 with Notification from the International Bureau (Form PCT/IB/326) in corresponding PCT International Application No. PCT/JP2017/033969 in Japanese.
English translation of the International Preliminary Report on Patentability (Chapter I) dated Apr. 4, 2019 with Notification from the International Bureau (Form PCT/IB/338) in corresponding PCT International Application No. PCT/JP2017/033969.

* cited by examiner

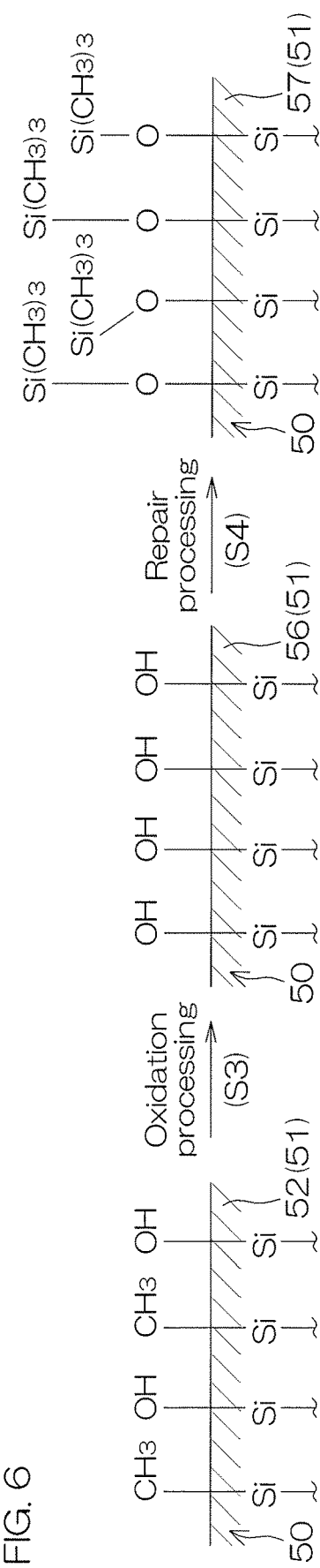

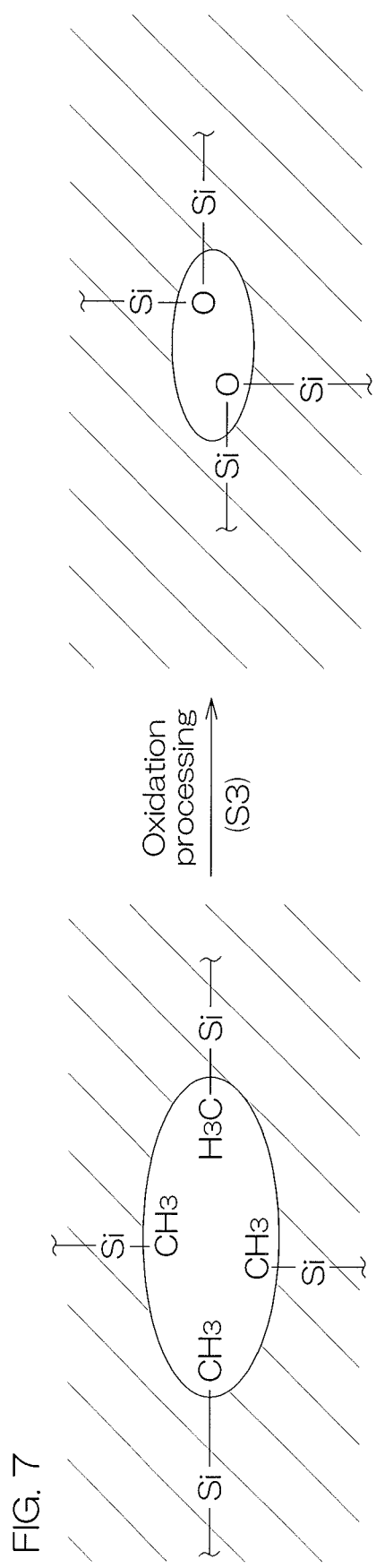

SUBSTRATE TREATMENT METHOD

CROSS-REFERENCE TO RELATED APPLICATIONS

The present application is a 35 U.S.C. §§ 371 national phase conversion of PCT/JP2017/033969, filed Sep. 20, 2017, which claims priority to Japanese Patent Application No. 2016-187250, filed Sep. 26, 2016, the contents of both of which are incorporated herein by reference. The PCT International Application was published in the Japanese language.

TECHNICAL FILED

The present invention relates to a substrate processing method for processing substrates. Examples of substrates to be processed include substrates such as semiconductor wafers, substrates for liquid crystal displays, substrates for plasma displays, substrates for FEDs (field emission display), substrates for optical disks, substrates for magnetic disks, substrates for magneto-optical disks, substrates for photomasks, ceramic substrates, substrates for solar cells, etc.

BACKGROUND ART

In recent years, a device which is fabricated by using a substrate (for example, a semiconductor device) is provided with an interlayer insulation film for insulation between wirings. In order to try to speed up the device, there has been demanded a reduction in parasitic capacitance of the interlayer insulation film. Thus, in order to reduce the parasitic capacitance, there has been proposed the use of a low dielectric constant (Low-k) film which is composed of a low dielectric constant material lower in dielectric constant (for example, 4.0 or lower) than silicon dioxide ($SiO_2$) as the interlayer insulation film.

When a substrate is subjected to dry etching or CMP (chemical mechanical polishing), the low dielectric constant film may be damaged. A damaged layer is formed in the vicinity of a surface of the damaged low dielectric constant film, thereby increasing a dielectric constant of the low dielectric constant film. Therefore, no expected device characteristics may be obtained. Thus, Patent Literature 1 discloses a method for repairing the damage of the low dielectric constant film.

CITATION LIST

Patent Literature

Patent Literature 1: Japanese Patent Application Publication No. 2008-10610

SUMMARY OF INVENTION

Technical Problem

According to the method described in Patent Literature 1, the damaged layer is exposed to a damage repairing agent and a pressure is also applied to the damage repairing agent. Thereby, the damage repairing agent will easily permeate into the damaged layer.

However, according to the method described in Patent Literature 1, the damage repairing agent may pass over the damaged layer and permeate into a part which is not damaged. That is, a damage repairing agent may excessively permeate into the low dielectric constant film.

The damage repairing agent permeates into a part of the low dielectric constant film which is not damaged, by which the low dielectric constant film may be changed in dielectric constant. Further, it is difficult to remove the damage repairing agent which has once permeated into the low dielectric constant film from the low dielectric constant film.

Thus, an object of the present invention is to provide a substrate processing method capable of suppressing a liquid-type repairing agent from excessively permeating into a low dielectric constant film.

Solution to Problem

The present invention provides a substrate processing method for processing a substrate in which a low dielectric constant film is formed on a front surface thereof, and the substrate processing method which includes a densification step of densifying a damaged layer formed on a surface layer portion of the low dielectric constant film is densified to change to a densified layer and a repair liquid supplying step of supplying a repair liquid, for repairing damage of the densified layer is supplied, to a front surface of the low dielectric constant film after the densification step.

According to the above-described method, the repair liquid is supplied to the front surface of the low dielectric constant film in which the damaged layer formed on the surface layer portion thereof has been changed to the densified layer. Thereby, the repair liquid in a liquid state permeates into the densified layer to repair damage of the densified layer. When the damaged layer is densified, the degree of densification is adjusted so that the thickness of the densified layer will be a desired thickness (for example, 1 nm to 5 nm). Thereby, in the repair liquid supplying step, the repair liquid supplied to the front surface of the low dielectric constant film passing over the densified layer and permeating into the low dielectric constant film is suppressed. That is, an excessive permeation of the repair liquid into the low dielectric constant film is suppressed.

In a preferred embodiment of the present invention, the densification step includes a step of forming the densified layer into which the repair liquid is less likely to permeate as compared with the damaged layer.

According to the above-described method, the repair liquid is less likely to permeate into the densified layer as compared with the damaged layer. Therefore, in the densified layer, the change in the degree (depth) of permeation of the repair liquid due to a change in supply conditions of the repair liquid (supply amount and supply time) is small, as compared with the damaged layer. Therefore, for example, even where an unexpected change occurs in supply conditions of the repair liquid, there is suppressed a change in the degree of permeation of the repair liquid. As a result, it is possible to easily control the degree of permeation of the repair liquid into the surface layer portion of the low dielectric constant film, as compared with substrate processing in which the damaged layer is not changed to the densified layer. Therefore, an excessive permeation of the repair liquid into the low dielectric constant film is further suppressed.

In a preferred embodiment of the present invention, the densification step includes a step of changing a part adjacent to the damaged layer in a surface layer portion of the low dielectric constant film to the densified layer.

According to the above-described method, in addition to the damaged layer, the part adjacent to the damaged layer in the surface layer portion of the low dielectric constant film is also changed to the densified layer. Therefore, it is possible to make the densified layer thick, as compared with a case where only the damaged layer is changed to the densified layer. As a result, even where the damaged layer is relatively thin, the repair liquid supplied to the front surface of the low dielectric constant film is suppressed from instantly passing over the densified layer and permeating into the low dielectric constant film. Thereby, the repair liquid is suppressed from excessively permeating into the low dielectric constant film.

In a preferred embodiment of the present invention, a plurality of pores are formed on the damaged layer. The densification step further includes a step of compressing the damaged layer to make the plurality of pores smaller, thereby changing the damaged layer to the densified layer.

According to the above-described method, the damaged layer is compressed to make the plurality of pores smaller, thereby changing the damaged layer to the densified layer. Therefore, the damaged layer is changed to the densified layer, by which permeation of the repair liquid into the low dielectric constant film through the pores is suppressed.

In a preferred embodiment of the present invention, the densification step includes a densifying agent supplying step of supplying the densifying agent, for changing the surface layer portion of the low dielectric constant film to the densified layer, to the front surface of the low dielectric constant film.

According to the above-described method, the densifying agent is supplied to the front surface of the low dielectric constant film to form the densified layer. Therefore, by adjusting the supply amount and supply time of the densifying agent, the degree of permeation of the densifying agent into the surface layer portion of the low dielectric constant film can be adjusted. As a result, it is possible to adjust the thickness of the densified layer to a desired thickness with high accuracy.

In a preferred embodiment of the present invention, the substrate processing method further includes a cleaning step of supplying a cleaning liquid to a front surface of the low dielectric constant film before the densifying agent supplying step, thereby cleaning the front surface of the low dielectric constant film.

According to the above-described method, before the densifying agent supplying step, the front surface of the low dielectric constant film is cleaned with the cleaning liquid. Thereby, dirt, etc., adhered to the front surface of the damaged layer are washed away. Therefore, the change in the degree (depth) of permeation of the densifying agent resulting from dirt on the front surface of the damaged layer is suppressed. Therefore, it is possible to adjust the thickness of the densified layer to a desired thickness with higher accuracy.

The above and other elements, features, steps, characteristics and advantages of the present invention will become more apparent from the following detailed description of the preferred embodiments with reference to the attached drawings.

BRIEF DESCRIPTION OF DRAWINGS

FIG. 6 is a schematic sectional view for describing a change in chemical structure of a surface layer portion of a low dielectric constant film by the substrate processing.

FIG. 7 is a schematic sectional view for describing a change in chemical structure of the surface layer portion of the low dielectric constant film by the substrate processing.

DESCRIPTION OF EMBODIMENTS

First Preferred Embodiment

Figure 1:
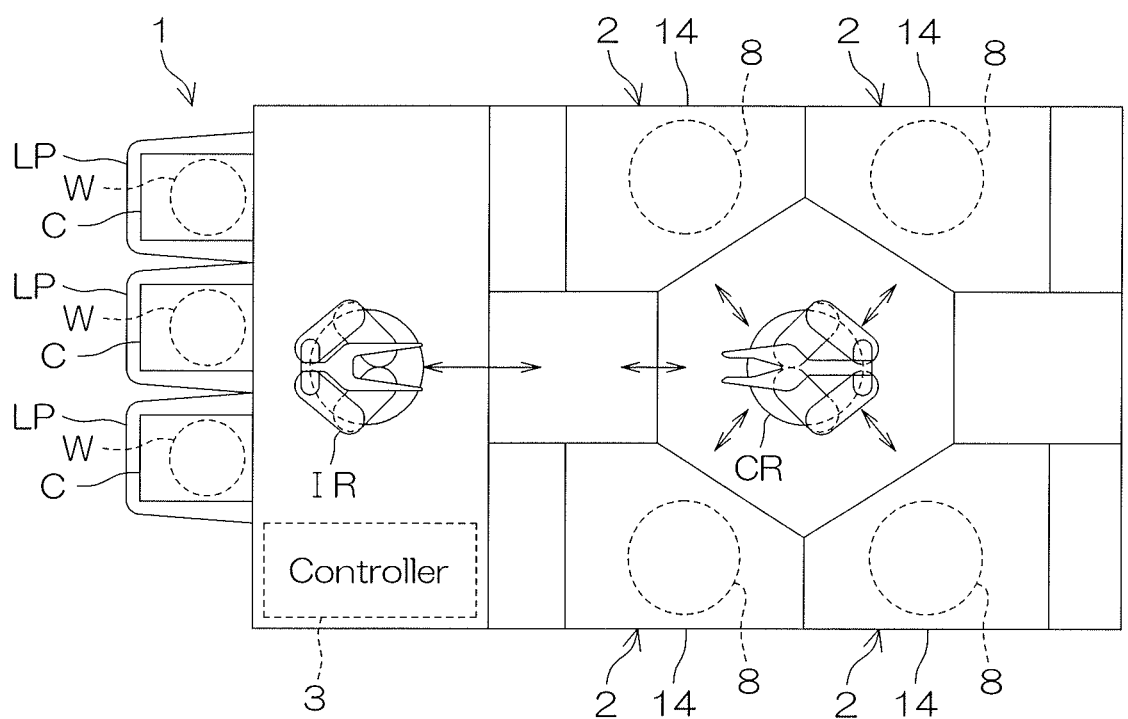
FIG. 1 is an illustrative plan view for describing an internal layout of a substrate processing apparatus according to a first preferred embodiment of the present invention.

FIG. 1 is an illustrative plan view for describing an internal layout of a substrate processing apparatus 1 according to the first preferred embodiment of the present invention. The substrate processing apparatus 1 is a single substrate processing type apparatus which processes a substrate W such as silicon wafer one at a time. In the present preferred embodiment, the substrate W is a disk-shaped substrate.

The substrate processing apparatus 1 includes a plurality of processing units 2 for processing a substrate W, a plurality of load ports LP, each of which has a carrier C for housing a plurality of substrates W that are processed by the processing units 2, transfer robots IR and CR which transfer a substrate W between a load port LP and a processing unit 2, and a controller 3 which controls the substrate processing apparatus 1. The transfer robot IR transfers a substrate W between the carrier C and the transfer robot CR. The transfer robot CR transfers a substrate W between the transfer robot IR and the processing unit 2. The plurality of processing units 2 are, for example, similar to each other in configuration.

Figure 2:
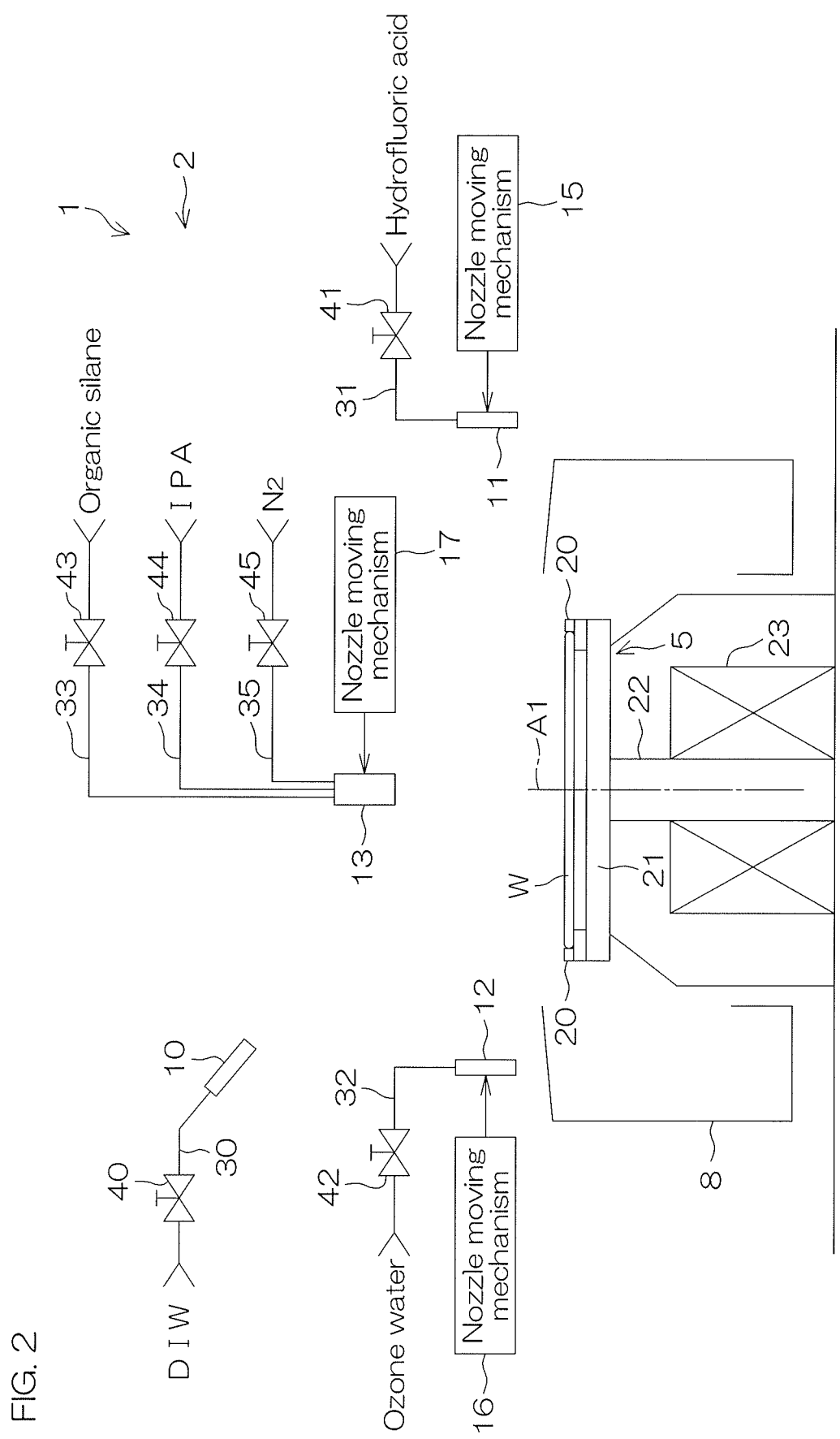
FIG. 2 is an illustrative longitudinal sectional view for describing one configuration example of a processing unit provided in the substrate processing apparatus.

FIG. 2 is an illustrative longitudinal sectional view for describing one configuration example of the processing unit 2.

The processing unit 2 includes a spin chuck 5 which holds a single substrate W in a horizontal posture and rotates the substrate W around a vertical rotation axis A1 passing through a central portion of the substrate W, a cylindrical cup 8 which surrounds the spin chuck 5, a DIW nozzle 10 which supplies deionized water (DIW) as a rinse liquid to an upper surface of the substrate W, and nozzles 11 to 13 (a first nozzle 11, a second nozzle 12 and a third nozzle 13), each of which supplies a fluid to the upper surface of the substrate W. The processing unit 2 further includes a chamber 14 (refer to FIG. 1) which houses the cup 8. A carry-in/carry-out port (not shown) for carrying in and carrying out the substrate W is formed in the chamber 14. The chamber 14 is provided with a shutter unit for opening and closing the carry-in/carry-out port.

The spin chuck 5 is included in a substrate holding/rotating unit which rotates the substrate W held horizontally around the predetermined rotation axis A1 along a vertical direction. The spin chuck 5 includes a chuck pin 20, a spin base 21, a rotation shaft 22 and an electric motor 23. The rotation shaft 22 extends along the rotation axis A1 in the vertical direction. An upper end of the rotation shaft 22 is coupled to a lower surface center of the spin base 21. The spin base 21 is formed in a disk shape along a horizontal direction. At a peripheral edge portion of an upper surface of the spin base 21, the plurality of chuck pins 20 are disposed at intervals in a circumferential direction. The electric motor 23 imparts a rotational force to the rotation shaft 22. The rotation shaft 22 is rotated by the electric motor 23 to rotate the substrate W around the rotation axis A1.

In the present preferred embodiment, the DIW nozzle 10 is a fixed nozzle which is disposed so as to discharge DIW to a rotational center of an upper surface of the substrate W. DIW is supplied from a DIW supply source to the DIW nozzle 10 via a DIW supply piping 30. A DIW valve 40 for opening and closing a flow passage inside the DIW supply piping 30 is interposed in the DIW supply piping 30. The DIW nozzle 10 is not required to be a fixed nozzle. The DIW nozzle 10 may be a moving nozzle which moves at least in the horizontal direction.

The DIW nozzle 10 may be a rinse liquid nozzle which supplies a rinse liquid other than DIW. The rinse liquid includes, for example, carbonated water, electrolyzed water, ozone water, hydrochloric acid water of dilute concentration (for example, approximately 1 ppm to 100 ppm), reduced water (hydrogen water) and ammonia water, in addition to DIW.

The first nozzle 11 is moved by the first nozzle moving mechanism 15 in the horizontal direction and in the vertical direction. The first nozzle 11 is able to move between a center position and a home position (retracted position) in the horizontal direction. The first nozzle 11 faces a rotational center of an upper surface of a substrate W when being positioned at the center position. The first nozzle 11 does not face the upper surface of the substrate W when being positioned at the home position. The home position is positioned outside the spin base 21 in a plan view. More specifically, the home position may be positioned outside the cup 8. The first nozzle 11 is not required to be a moving nozzle that is moved by the first nozzle moving mechanism 15. The first nozzle 11 may be a fixed nozzle, the position of which is fixed in the horizontal direction and in the vertical direction.

In the present preferred embodiment, the first nozzle 11 has a function as a cleaning liquid supply means which supplies a cleaning liquid such as hydrofluoric acid for cleaning the upper surface of the substrate W to the upper surface of the substrate W. A cleaning liquid supply piping 31 is coupled to the first nozzle 11. A cleaning liquid valve 41 for opening and closing a flow passage inside the cleaning liquid supply piping 31 is interposed in the cleaning liquid supply piping 31. A cleaning liquid such as hydrofluoric acid is supplied from a cleaning liquid supply source to the cleaning liquid supply piping 31.

The cleaning liquid is not limited to hydrofluoric acid. As the cleaning liquid, in addition to hydrofluoric acid, there is cited a polymer removing liquid which is capable of removing polymer residues (refer to FIG. 5A to be described later) formed on the upper surface of the substrate W by dry etching or CMP. As the polymer removing liquid, there is cited a fluorine compound such as ammonium fluoride, a water-soluble organic solvent and a composition composed of a buffer and a basic compound that are usable, for example, for a metal and a low dielectric constant film (the examples are shown in Japanese Patent Application Publication No. 2003-241400).

The second nozzle 12 is moved by the second nozzle moving mechanism 16 in the horizontal direction and in the vertical direction. The second nozzle 12 is able to move between a center position and a home position (retracted position) in the horizontal direction. The second nozzle 12 faces the rotational center of the upper surface of the substrate W when being positioned at the center position. The second nozzle 12 does not face the upper surface of the substrate W when being positioned at the home position. The home position is positioned outside the spin base 21 in a plan view. More specifically, the home position may be positioned outside the cup 8. The second nozzle 12 is not required to be a moving nozzle that is moved by the second nozzle moving mechanism 16. The second nozzle 12 may be a fixed nozzle, the position of which is fixed in the horizontal direction and in the vertical direction.

In the present preferred embodiment, the second nozzle 12 has a function as an oxidizing agent supply means for supplying a liquid-type oxidizing agent such as ozone water to the upper surface of the substrate W. An oxidizing agent supply piping 32 is coupled to the second nozzle 12. An oxidizing agent valve 42 for opening and closing a flow passage inside the oxidizing agent supply piping 32 is interposed in the oxidizing agent supply piping 32. The liquid-type oxidizing agent such as ozone water is supplied from an oxidizing agent supply source to the oxidizing agent supply piping 32. As the oxidizing agent, in addition to ozone water, there is cited a liquid-type oxidizing agent such as SC1 (ammonia-hydrogen peroxide mixture). Unlike the present preferred embodiment, the oxidizing agent supplied to the upper surface of the substrate W may be a gas such as ozone.

The third nozzle 13 is moved by the third nozzle moving mechanism 17 in the horizontal direction and in the vertical direction. The third nozzle 13 is able to move between a center position and a home position (retracted position) in the horizontal direction. The third nozzle 13 faces the rotational center of the upper surface of the substrate W when being positioned at the center position. The third nozzle 13 does not face the upper surface of the substrate W when being positioned at the home position. The home position is positioned outside the spin base 21 in a plan view. More specifically, the home position may be positioned outside the cup 8. The third nozzle 13 is not required to be a moving nozzle that is moved by the third nozzle moving mechanism 17. The third nozzle 13 may be a fixed nozzle, the position of which is fixed in the horizontal direction and in the vertical direction.

In the present preferred embodiment, the third nozzle 13 has a function as a repair liquid supply means for supplying a repair liquid such as liquid-type organic silane to the upper surface of the substrate W, a function as an organic solvent supply means for supplying an organic solvent such as isopropyl alcohol (IPA) to the upper surface of the substrate W and a function as an inert gas supply means for supplying an inert gas such as nitrogen gas ($N_2$) to the upper surface of the substrate W.

A repair liquid supply piping 33, an organic solvent supply piping 34 and an inert gas supply piping 35 are coupled to the third nozzle 13. A repair liquid valve 43 for opening and closing a flow passage inside the repair liquid supply piping 33 is interposed in the repair liquid supply piping 33. A repair liquid such as liquid-type organic silane is supplied from a repair liquid supply source to the repair liquid supply piping 33. An organic solvent valve 44 for opening and closing a flow passage inside the organic solvent supply piping 34 is interposed in the organic solvent supply piping 34. An organic solvent such as IPA is supplied from an organic solvent supply source to the organic solvent supply piping 34. An inert gas valve 45 for opening and closing a flow passage inside the inert gas supply piping 35 is interposed in the inert gas supply piping 35. An inert gas such as nitrogen gas is supplied from an inert gas supply source to the inert gas supply piping 35.

The liquid-type organic silane used as a repair liquid is a silane compound which has at least carbon. As the liquid-type organic silane, there is cited specifically a liquid which contains at least any one of 1, 1, 3, 3-tetramethyldisilazane (TMDS), trimethylsilyldimethylamine (TMSDMA), trimethylsilyldiethylamine (TMSDEA) dimethylsilyldimethylamine (DMSDMA), trimethylmethylaminosilane (TMMAS), trimethyl (isocyanate) silane (TMICS), trimethylsilylacetylene (TMSA), trimethylsilylcyanide (TMSC), hexamethyldisilazane (HMDS), hexamethylcyclotrisiloxane (HMCTS), tetramethyldisilazane (TMDS), chlorotrimethylsilane (TMCS), bromotrimethyl silane (TMBS), iodinetrimethylsilane (TMIS), trimethylmethoxysilane (TMMS), dimethyldimethoxysilane (DMDMS), dimethyldiacetoxysilane (DMDAS), dimethylaminodimethylsilane (DMADMS), dichlorodimethylsilane (DMDCS), 1-trimethylsilylpyrrole (TMSPyrole), N, O-bis (trimethylsilyl) trifluoroacetamide (BSTFA), bis (dimethylamino) dimethylsilane (BDMADMS), acetic acid O-trimethylsilyl (OTMSA), phenyltrimethoxysilane (PTMOS), phenyldimethylchlorosilane (PDMCS), 1, 1, 3, 3-tetramethyl-1, 3-diphenyldisilazane (DPTMDS), dimethylbutylchlorosilane (BDMCS), dimethyloctylchlorosilane (ODMCS) and dimethyldecylchlorosilane (DDMCS).

The organic solvent is not limited to IPA. The organic solvent may be any solvent which is miscible with liquid-type organic silane and also higher in volatility than pure water. The organic solvent may be, for example, benzene, propylene glycol 1-monomethylether 2-acetate (PEGMEA), etc.

The inert gas is not limited to nitrogen gas. The inert gas is a gas which is inert to the upper surface of the substrate W. The inert gas may be, for example, a rare gas such as argon.

Figure 3:
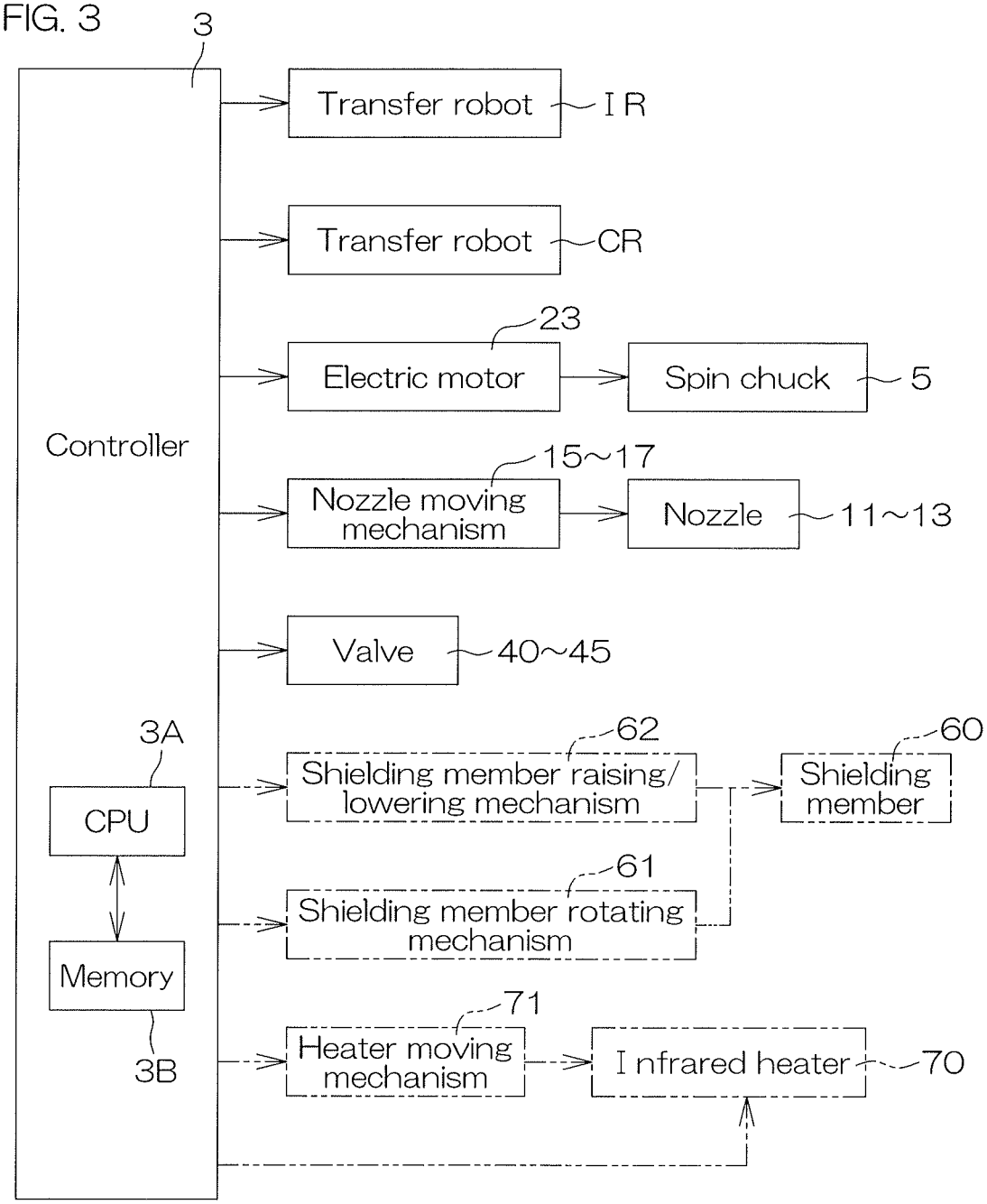
FIG. 3 is a block diagram for describing an electrical configuration of main portions of the substrate processing apparatus.

FIG. 3 is a block diagram for describing an electrical configuration of main portions of the substrate processing apparatus 1. The controller 3 is provided with a microcomputer and controls control targets installed on the substrate processing apparatus 1 according to predetermined programs. More specifically, the controller 3 includes a processor (CPU) 3A and a memory 3B in which the programs are housed and is arranged so as to execute various types of control for substrate processing by a control program executed by the processor 3A. The controller 3 controls, in particular, motions of the transfer robots IR, CR, the electric motor 23, the nozzle moving mechanisms 15 to 17 and valves 40 to 45.

Figure 4:
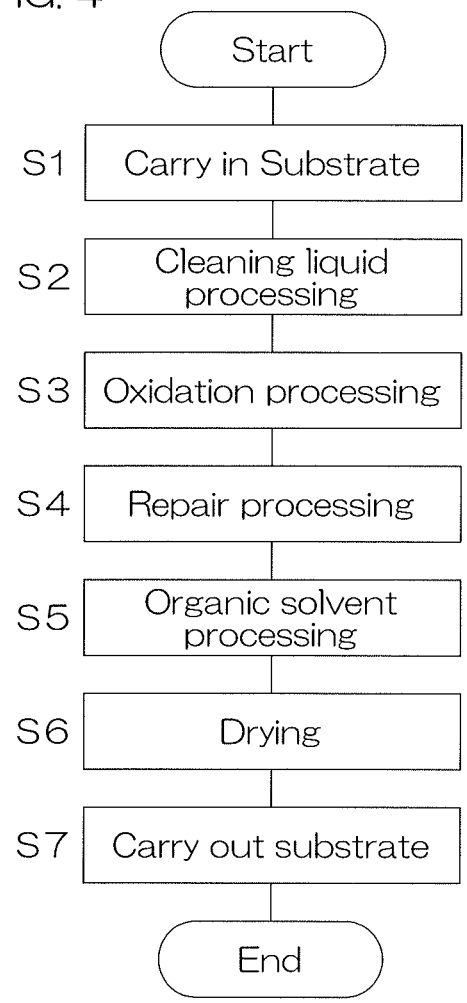
FIG. 4 is a flowchart for describing one example of substrate processing by the substrate processing apparatus.

FIG. 4 is a flowchart for describing one example of substrate processing by the substrate processing apparatus 1, mainly showing the processing realized by the controller 3 which executes a program.

In the substrate processing by the substrate processing apparatus 1, for example, as shown in FIG. 4, substrate carry-in (S1), cleaning processing (S2), oxidation processing (S3), repair processing (S4), organic solvent processing (S5), drying processing (S6) and substrate carry-out (S7) are executed in this order.

First, in the substrate processing by the substrate processing apparatus 1, a substrate W to which dry etching or CMP has been given is carried in the processing unit 2 from the carrier C by the transfer robots IR and CR and delivered to the spin chuck 5 (S1). Thereafter, the substrate W is held horizontally at intervals above from an upper surface of the spin base 21 by the chuck pin 20 until the substrate W is carried out by the transfer robot CR (substrate holding step). The controller 3 may continue to supply an inert gas to the upper surface of the substrate W, with the inert gas valve 45 kept open, until the substrate W is carried out by the transfer robot CR (inert gas supplying step). The inert gas supplying step can be stopped whenever necessary. In the substrate processing, a liquid supplied on the substrate W in a rotating state is scattered radially outward from a peripheral edge of the substrate W, due to a centrifugal force, and received by the cup 8.

Then, cleaning processing (S2) for cleaning the upper surface of the substrate W held by the chuck pin 20 is executed.

Specifically, the controller 3 drives the electric motor 23 to rotate the substrate W, together with the spin base 21, for example, at 100 rpm (substrate rotating step). The substrate rotating step at this rotating speed may continue until start of the drying processing (S6) which will be described later. Then, the controller 3 controls the first nozzle moving mechanism 15 and disposes the first nozzle 11 at a processing position above the substrate W. When the first nozzle 11 is positioned at the processing position, a cleaning liquid such as hydrofluoric acid discharged from the first nozzle 11 may be supplied to a rotational center of the upper surface of the substrate W. Then, the controller 3 opens the cleaning liquid valve 41 and supplies the cleaning liquid such as hydrofluoric acid from the first nozzle 11 to the upper surface of the substrate W in a rotating state (cleaning liquid supplying step). The cleaning liquid supplied to the upper surface of the substrate W in a rotating state flows radially outward along the upper surface of the substrate W due to a centrifugal force. Thereby, the cleaning liquid spreads over the entire upper surface of the substrate W.

Next, after the cleaning processing (S2) for a fixed time, oxidation processing (S3) in which the upper surface of the substrate W is processed by an oxidizing agent is executed.

Specifically, the controller 3 controls the second nozzle moving mechanism 16 and disposes the second nozzle 12 at a processing position above the substrate W. When the second nozzle 12 is positioned at the processing position, an oxidizing agent such as ozone water discharged from the second nozzle 12 may be supplied to the rotational center of the upper surface of the substrate W. Then, the controller 3 closes the cleaning liquid valve 41 and, instead, opens the oxidizing agent valve 42. Thereby, the oxidizing agent such as ozone water is supplied from the second nozzle 12 to the upper surface of the substrate W in a rotating state (oxidizing agent supplying step). The oxidizing agent placed on the upper surface of the substrate W flows radially outward along the upper surface of the substrate W due to a centrifugal force. Thereby, the cleaning liquid on the substrate W is replaced by the oxidizing agent. On the other hand, the controller 3 controls the first nozzle moving mechanism 15 and allows the first nozzle 11 to retract to the retracted position.

In the oxidation processing (S3), unlike the substrate processing of the present preferred embodiment, the controller 3 may supply an oxidizing agent from the second nozzle 12 to the upper surface of the substrate W, after supply of DIW from the DIW nozzle 10 to the upper surface of the substrate W to replace the cleaning liquid on the substrate W by DIW.

Substrate processing conditions in a case where ozone water is used as the oxidizing agent are, for example, such processing conditions that an ozone concentration is 20 ppb, a liquid is processed at a room temperature (usually in a range of 15 to 30° C.), processing time is one minute to two minutes and a substrate rotating speed is approximately 100 rpm.

In order to oxidize uniformly an entire upper surface of the substrate W, it is preferable that the second nozzle 12 for supplying ozone water is moved by the second nozzle moving mechanism 16 in the horizontal direction.

Substrate processing conditions in a case where SC1 is used as the oxidizing agent are, for example, such processing conditions that SC1 is composed of ammonium hydroxide, hydrogen peroxide and water in a ratio of 1:4:20, a liquid is processed at a temperature of 65° C., processing time is one minute to two minutes and a substrate rotating speed is about 100 rpm.

In order to uniformly oxidize an entire upper surface of the substrate W, it is preferable that the second nozzle 12 for supplying SC1 is moved by the second nozzle moving mechanism 16 in the horizontal direction.

Further, the oxidation processing (S3) may be processing in which ozone gas is exposed to a substrate W. In the oxidation processing (S3), the oxidation processing by the above-described oxidizing agent may be executed in parallel with oxidation processing by UV irradiation. Still further, in the oxidation processing (S3), the oxidation processing by UV irradiation may be executed without execution of the oxidation processing by the oxidizing agent.

Next, after the oxidation processing (S3) for a fixed time, repair processing (S4) in which the upper surface of the substrate W is processed by a repair liquid such as liquid-type organic silane is executed.

Specifically, the controller 3 controls the third nozzle moving mechanism 17 to dispose the third nozzle 13 at a processing position above the substrate W. When the third nozzle 13 is positioned at the processing position, a repair liquid and an organic solvent discharged from the third nozzle 13 may be supplied to the rotational center of the upper surface of the substrate W. Then, the controller 3 closes the oxidizing agent valve 42 and, instead, opens the organic solvent valve 44. Thereby, the organic solvent such as IPA discharged from the third nozzle 13 is landed on the upper surface of the substrate W in a rotating state and, thereafter, flows radially outward along the upper surface of the substrate W due to a centrifugal force. Thereby, the liquid-type oxidizing agent on the substrate W is replaced by the organic solvent. Then, the controller 3 controls the second nozzle moving mechanism 16 and allows the second nozzle 12 to retract to the retracted position. Thereafter, the controller 3 closes the organic solvent valve 44 and, instead, opens the repair liquid valve 43. Thereby, the repair liquid such as liquid-type organic silane is supplied from the third nozzle 13 to the upper surface of the substrate W (repair liquid supplying step). The repair liquid placed on the upper surface of the substrate W flows radially outward along the upper surface of the substrate W due to a centrifugal force. Thereby, the organic solvent on the substrate W is replaced by the repair liquid. In the repair processing (S4), the upper surface of the substrate W is covered with an inert gas to decrease humidity around the upper surface of the substrate W. Therefore, a decrease in activity of the repair liquid resulting from the humidity is suppressed.

Next, after the repair processing (S4) for a fixed time, organic solvent processing (S5) in which the repair liquid on the upper surface of the substrate W is replaced by the organic solvent such as IPA is executed.

Specifically, the controller 3 closes the repair liquid valve 43 and, instead, opens the organic solvent valve 44. Thereby, the organic solvent such as IPA discharged from the third nozzle 13 is landed on the upper surface of the substrate W. Thereafter, the organic solvent landed on the upper surface of the substrate W flows radially outward along the upper surface of the substrate W due to a centrifugal force. Thereby, the repair liquid on the substrate W is replaced by the organic solvent.

Next, the drying processing (S6) for drying the substrate W is executed.

Specifically, the controller 3 closes the repair liquid valve 43 and controls the third nozzle moving mechanism 17, thereby allowing the third nozzle 13 to retract to the retracted position. Then, the controller 3 controls the electric motor 23 to rotate the substrate W at a higher rotating speed (for example, 500 to 3000 rpm) than a rotating speed of the substrate W from the cleaning processing (S2) to the organic solvent processing (S5). Thereby, a large centrifugal force acts on the organic solvent on the substrate W. Therefore, the organic solvent on the substrate W is spun off around the substrate W. As described above, the organic solvent is removed from the substrate W. Thereby, the substrate W is dried. Then, the controller 3 stops rotation of the substrate W by the spin base 21 when a predetermined time has elapsed from the start of high-speed rotation of the substrate W.

Thereafter, the transfer robot CR advances into the processing unit 2, scoops up a substrate W which has been processed from the spin chuck 5 and carries it out from the processing unit 2 (S7). The substrate W is delivered from the transfer robot CR to the transfer robot IR. Then, the substrate W is housed into the carrier C by the transfer robot IR.

Next, a description will be given of a change in state in the vicinity of the front surface of the substrate W by the substrate processing.

FIG. 5A to FIG. 5D are each a sectional view for describing a change in configuration of the front surface of the substrate W by the substrate processing.

Figure 5A:
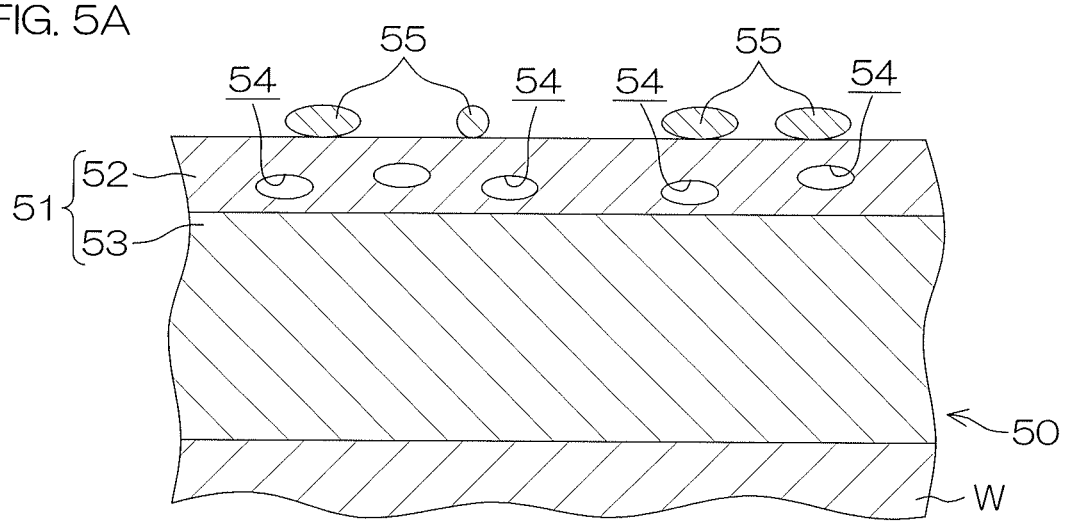
FIG. 5A is a sectional view for describing a change in configuration of a front surface of a substrate by substrate processing.

FIG. 5A is a longitudinal sectional view in the vicinity of the front surface of the substrate W before the substrate processing. With reference to FIG. 5A, a low dielectric constant film 50 is formed on the entire upper surface of the substrate W (the front surface of the substrate W) held by the chuck pin 20. The low dielectric constant film 50 is a film composed of a material of low dielectric constant (Low-k) which is a material lower in dielectric constant than silicon dioxide ($SiO_2$). Specifically, the low dielectric constant film 50 is composed of an insulation material (SiOC) in which carbon is added to silicon dioxide ($SiO_2$).

The surface layer portion 51 of the low dielectric constant film 50 is provided with a damaged layer 52 and a non-damaged layer 53. The surface layer portion 51 of the low dielectric constant film 50 is a part in the vicinity of a front surface of the low dielectric constant film 50 on a side opposite to the substrate W.

The damaged layer 52 is a part which has been damaged in the surface layer portion 51 of the low dielectric constant film 50. The damaged layer 52 is exposed from the entire front surface of the low dielectric constant film 50. The non-damaged layer 53 is a part which has not been damaged in the surface layer portion 51 of the low dielectric constant film 50. The non-damaged layer 53 is adjacent to the damaged layer 52 in a thickness direction of the low dielectric constant film 50. The thickness direction of the low dielectric constant film 50 is a direction which is substantially vertical to the front surface of the low dielectric constant film 50. The damage means an increase in dielectric constant. The damage is, specifically, such that, due to chemical and physical actions, a methyl group is substituted by a hydroxyl group, and moisture in an atmosphere with a dielectric constant of about 80 is adsorbed to the hydroxyl group, thereby increasing the dielectric constant. The damaged layer 52 of the low dielectric constant film 50 is higher in dielectric constant than the non-damaged layer 53.

The damaged layer 52 is a part at which the plurality of pores 54 are formed in the surface layer portion 51 of the low dielectric constant film 50. The damaged layer 52 is, for example, 1 nm to 3 nm in thickness. The thickness of the damaged layer 52 is the width of the damaged layer 52 in the thickness direction of the low dielectric constant film 50. There is also a case that a plurality of pores (not shown) are formed at a part other than the damaged layer 52 of the low dielectric constant film 50. Since some of methyl groups are substituted by hydroxyl groups due to the damage, moisture stays at the plurality of pores 54 on the damaged layer 52. Therefore, the plurality of pores 54 of the damaged layer 52 are increased further in dielectric constant than the pores formed at a part of the low dielectric constant film 50 other than the damaged layer 52.

The low dielectric constant film 50 is damaged by dry etching or CMP to form the damaged layer 52 in the surface layer portion 51 of the low dielectric constant film 50. Polymer residues 55 generated by dry etching or CMP which is a previous step of substrate processing by the substrate processing apparatus 1 is adhered to the front surface of the damaged layer 52 before execution of the cleaning processing (S2 in FIG. 4).

Figure 5B:
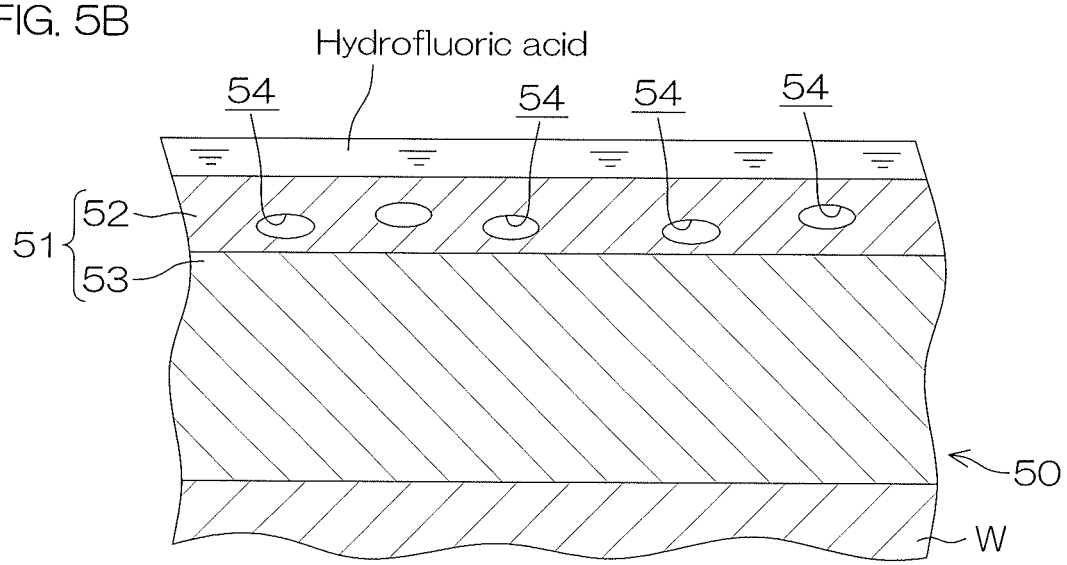
FIG. 5B is a sectional view for describing a change in configuration of the front surface of the substrate by substrate processing.

FIG. 5B is a longitudinal sectional view in the vicinity of the front surface of the substrate W in the cleaning processing (S2 in FIG. 4). With reference to FIG. 5B, in the cleaning processing, a cleaning liquid such as hydrofluoric acid is supplied to the front surface of the low dielectric constant film 50 formed on the front surface of the substrate W. Thereby, the polymer residues 55 (refer to FIG. 5A) is removed to clean the front surface of the low dielectric constant film 50. That is, in the cleaning processing, the cleaning liquid is supplied to the front surface of the low dielectric constant film 50, thereby cleaning the front surface of the low dielectric constant film 50 (cleaning step). Where the cleaning liquid is hydrofluoric acid, part of the damaged layer 52 may be removed together with the polymer residues 55.

Figure 5C:
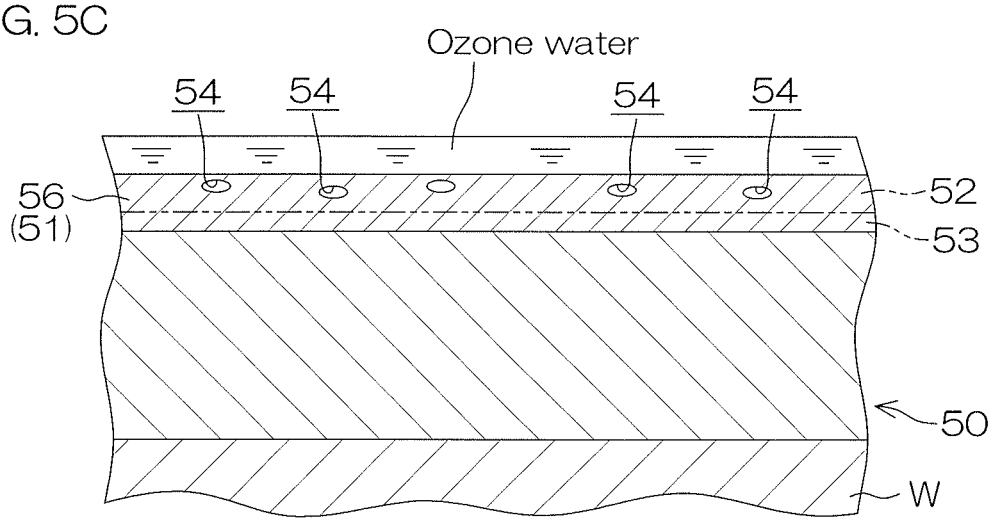
FIG. 5C is a sectional view for describing a change in configuration of the front surface of the substrate by substrate processing.

FIG. 5C is a longitudinal sectional view in the vicinity of the front surface of the substrate W during the oxidation processing (S3 in FIG. 4). With reference to FIG. 5C, in the oxidation processing (S3 in FIG. 4), a liquid-type oxidizing agent such as ozone water is supplied to the front surface of the low dielectric constant film 50 formed on the front surface of the substrate W. Thereby, the liquid-type oxidizing agent permeates from the front surface of the low dielectric constant film 50 into the surface layer portion 51 of the low dielectric constant film 50. Thereby, the surface layer portion 51 of the low dielectric constant film 50 is subjected to oxidation. Thereby, the damaged layer 52 and the non-damaged layer 53 in the surface layer portion 51 of the low dielectric constant film 50 are densified and changed to a densified layer 56 (densification step, densified layer forming step). For the convenience of description, FIG. 5C shows the damaged layer 52 and the non-damaged layer 53 before being changed to the densified layer 56. The damaged layer 52 is compressed to make the plurality of pores 54 smaller, by which the damaged layer 52 is changed to the densified layer 56. As described so far, the oxidizing agent is supplied to the front surface of the low dielectric constant film 50 to form the densified layer 56. That is, the oxidizing agent has a function as a densifying agent for forming the densified layer 56, and the oxidizing agent supplying step is an example of the densifying agent supplying step. The previously described cleaning step is executed before the densifying agent supplying step.

Figure 5D:
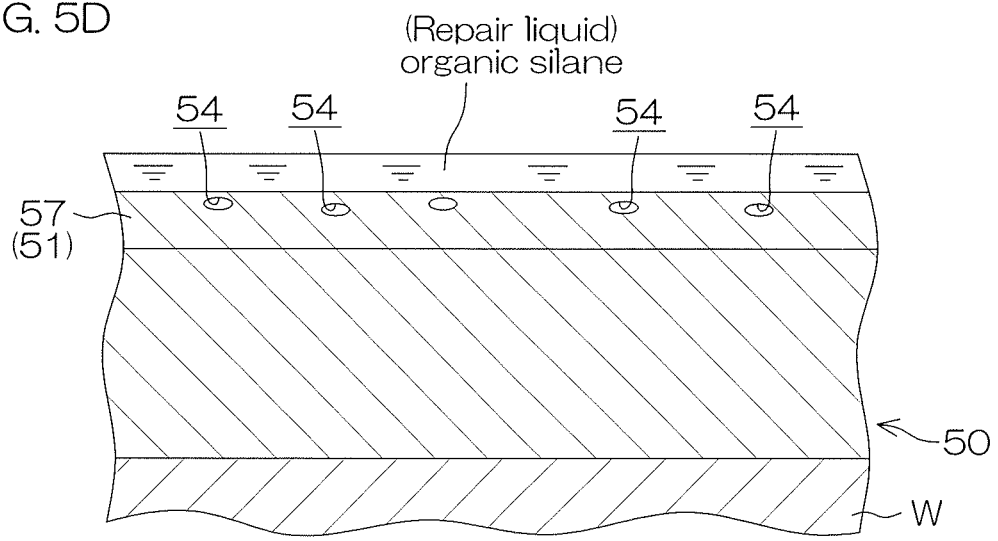
FIG. 5D is a sectional view for describing a change in configuration of the front surface of the substrate by substrate processing.

FIG. 5D is a longitudinal sectional view in the vicinity of the front surface of the substrate W during the repair processing (S4 in FIG. 4). With reference to FIG. 5D, in the repair processing (S4) after the oxidation processing (S3 in FIG. 4), a repair liquid is supplied to the front surface of the low dielectric constant film 50 formed on the front surface of the substrate W (repair liquid supplying step). Thereby, the repair liquid permeates from the front surface of the low dielectric constant film 50 into the densified layer 56 in the surface layer portion 51 of the low dielectric constant film 50. Thereby, the densified layer 56 is repaired. The densified layer 56 is densified to a greater degree than the damaged layer 52 and, therefore, the repair liquid is less likely to permeate into the densified layer 56 than the damaged layer 52.

As described previously, the plurality of pores 54 in the surface layer portion 51 becomes smaller by the oxidation processing (S3 in FIG. 4). Here, a description will be given of a configuration of the densified layer 56 capable of effectively suppressing a repair liquid from passing over the densified layer 56 and permeating into the low dielectric constant film 50 with reference to, for example, processing of the low dielectric constant film 50 with a relative dielectric constant of 2.5 which has been formed by PECVD (plasma-enhanced chemical vapor deposition).

It is assumed that the plurality of pores 54 with a diameter of about 1 nm to 3 nm are formed at a porosity of 20% in the surface layer portion 51 of the low dielectric constant film 50 before the oxidation processing (S3). The porosity is a volume ratio of the pores 54 in relation to a whole volume of the surface layer portion 51. The above-described low dielectric constant film 50 is subjected to the oxidation processing (S3), thereby forming the densified layer 56 having, for example, a porosity of 0% to 10% and the thickness of 1 nm to 5 nm within the surface layer portion 51. Where the above-described densified layer 56 is formed in the surface layer portion 51, in the repair processing (S4) which is executed subsequent to the oxidation processing (S3), the repair liquid supplied to the front surface of the low dielectric constant film 50 can be effectively suppressed from passing over the densified layer 56 and permeating into the low dielectric constant film 50.

The repair liquid permeates into the densified layer 56 to repair damage of the surface layer portion 51 of the low dielectric constant film 50. Thereby, the densified layer 56 is changed to a repair layer 57. The repair layer 57 is lower in dielectric constant than the damaged layer 52. The repair layer 57 is equal in dielectric constant to the non-damaged layer 53.

Next, a detailed description will be given of a change in chemical structure of the surface layer portion 51 of the low dielectric constant film 50 by the oxidation processing (S3) and the repair processing (S4). Although not shown, a methyl group (CH$_3$) bonded to a silicon atom (Si) is exposed on the front surface of the low dielectric constant film 50 before dry etching or CMP is performed. The low dielectric constant film 50 is subjected to etching or CMP, by which some methyl groups on the front surface of the low dielectric constant film 50 are substituted by hydroxyl groups (OH). The hydroxyl groups increase a dielectric constant of the low dielectric constant film 50. That is, some methyl groups on the front surface of the low dielectric constant film 50 are substituted by hydroxyl groups to damage the low dielectric constant film 50.

Therefore, with reference to FIG. 6, after etching or CMP is performed and also before the oxidation processing (S3), a methyl group bonded to a silicon atom and a hydroxyl group bonded to a silicon atom are exposed on the front surface of the low dielectric constant film 50 (the front surface of the damaged layer 52).

In the oxidation processing (S3), the surface layer portion 51 of the low dielectric constant film 50 is oxidized by an oxidizing agent. Thereby, a methyl group on the front surface of the low dielectric constant film 50 is substituted by a hydroxyl group. The hydroxyl group is mainly exposed on the front surface of the low dielectric constant film 50 after the oxidation processing, that is, on the front surface of the densified layer 56.

Then, in the repair processing (S4), where the repair liquid is liquid-type organic silane, the densified layer 56 is silylated. Thereby, a hydroxyl group on the front surface of the low dielectric constant film 50 is substituted by a chemical structure derived from organic silane. Where the organic silane is alkyl silane, a hydrogen atom of the hydroxyl group on the front surface of the low dielectric constant film 50 is substituted by an alkylsilyl group. The alkylsilyl group is a linear-chain or branched-chain functional group having a carbon atom. As the alkylsilyl group, there are cited, for example, a trimethyl silyl group, a triethylsilyl group, a dimethylsilyl group, diethylsilyl group and a dimethylethylsilyl group.

A specific description will be given of silylation by alkyl silane. FIG. 6 shows a case in which alkyl silane used in silylation of the surface layer portion 51 of the low dielectric constant film 50 is hexamethylenediamine (HMDS). In this case, the hydroxyl group on the front surface of the low dielectric constant film 50 is substituted by (—O—Si—(CH$_3$)$_3$).

Further, where the organic silane is, for example, chloro (decyl) dimethyl silane, as shown in Chemical Formula 1 given below, a hydrogen atom of the hydroxyl group on the front surface of the low dielectric constant film 50 is substituted by an alkylsilyl group.

[Chemical Formula 1]

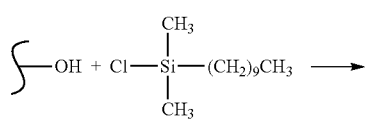

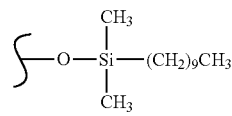

Further, where the organic silane is, for example, chloro (dodecyl) dimethyl silane, as shown in Chemical Formula 2 given below, a hydrogen atom of a hydroxyl group on the front surface of the low dielectric constant film 50 is substituted by an alkylsilyl group.

[Chemical Formula 2]

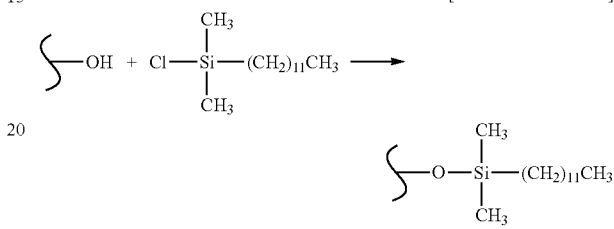

With reference to FIG. 7, before the oxidation processing (S3), not only a hydroxyl group (not shown) but also a bond (—Si—CH$_3$) of a silicon atom with a methyl group are exposed on a surface which surrounds the pores 54 on the damaged layer 52 of the low dielectric constant film 50. In the oxidation processing (S3), the surface layer portion 51 of the low dielectric constant film 50 is oxidized by an oxidizing agent. Thereby, two methyl groups exposed from the surface which surrounds the pores 54 on the damaged layer 52 are substituted by one oxygen atom. In other words, two methyl groups are separated individually from corresponding silicon atoms to form a siloxane bond (Si—O—Si). Therefore, the chemical structure present on the surface which surrounds the pores 54 on the damaged layer 52 is decreased in volume and the pores 54 become smaller. Since many hydroxyl groups and siloxane bonds which are higher in hydrophilicity (lower in hydrophobicity) than a methyl group are present in the densified layer 56, the densified layer 56 is lower in hydrophobicity than the damaged layer 52. Therefore, organic silane which contains a functional group high in hydrophobicity is less likely to permeate into the densified layer 56 as compared with the damaged layer 52.

According to the present preferred embodiment, the repair liquid is supplied to the front surface of the low dielectric constant film 50 in which the damaged layer 52 formed in the surface layer portion 51 is changed to the densified layer 56. Thereby, the repair liquid permeates into the densified layer 56 to repair damage of the densified layer 56. When the damaged layer 52 is changed to the densified layer 56, the degree of densification is adjusted such that the thickness of the densified layer 56 can be a desired thickness (specifically, 1 nm to 5 nm). Thereby, in the repair liquid supplying step, the repair liquid supplied to the front surface of the low dielectric constant film 50 passing over the densified layer 56 and permeating into the low dielectric constant film 50 is suppressed. That is, an excessive permeation of the repair liquid into the low dielectric constant film 50 is suppressed.

Further, according to the present preferred embodiment, the repair liquid is less likely to permeate into the densified layer 56 as compared with the damaged layer 52. Therefore, in the densified layer 56, the change in the degree (depth) of permeation of the repair liquid due to a change in supply conditions of the repair liquid (supply amount and supply time) is small, as compared with the damaged layer 52. Therefore, even where, for example, supply conditions of the repair liquid undergo an unintended change, the degree of permeation of the repair liquid can be suppressed. As a result, it is possible to easily control the degree of permeation of the repair liquid into the surface layer portion 51 of the low dielectric constant film 50, as compared with the substrate processing in which the damaged layer 52 is not changed to the densified layer 56. Therefore, an excessive permeation of the repair liquid into the low dielectric constant film 50 can be further suppressed.

Further, according to the present preferred embodiment, in addition to the damaged layer 52, the non-damaged layer 53 (a part adjacent to the damaged layer 52 in the surface layer portion 51) is also changed to the densified layer 56. Therefore, the densified layer 56 can be made thicker as compared with a case where only the damaged layer 52 is changed to the densified layer 56. As a result, even where the damaged layer 52 is relatively thin, the repair liquid supplied to the front surface of the low dielectric constant film 50 is suppressed from instantly passing over the densified layer 56 and permeating into the low dielectric constant film 50. Thereby, an excessive permeation of the repair liquid into the low dielectric constant film 50 is suppressed.

Further, according to the present preferred embodiment, the damaged layer 52 is compressed to reduce the size of the plurality of pores 54. Thereby, the damaged layer 52 is changed to the densified layer 56. Therefore, the damaged layer 52 is changed to the densified layer 56 to suppress the repair liquid from passing through the pores 54 and permeating into the low dielectric constant film 50.

Further, according to the present preferred embodiment, the oxidizing agent (densifying agent) is supplied to the front surface of the low dielectric constant film 50 to form the densified layer 56. Therefore, the oxidizing agent is adjusted for supply conditions (supply amount, supply time and so on), thus making it possible to adjust the degree of permeation of the oxidizing agent into the surface layer portion 51 of the low dielectric constant film 50. As a result, it is possible to adjust the thickness of the densified layer 56 to a desired thickness with high accuracy.

Further, according to the present preferred embodiment, before the oxidizing agent supplying step (densifying agent supplying step), the front surface of the damaged layer 52 is washed away by a cleaning liquid. Therefore, a change in the degree (depth) of permeation of the densifying agent caused by dirt (polymer residues 55) on the front surface of the damaged layer 52 is suppressed. Therefore, it is possible to adjust the thickness of the densified layer 56 to a desired thickness with higher accuracy.

Still further, according to the present preferred embodiment, the cleaning processing (S2) and the oxidation processing (S3) are each executed as different processing (step). Therefore, it is possible to optimally select a cleaning liquid suitable for cleaning the front surface of the low dielectric constant film 50 and an oxidizing agent for the surface layer portion 51 of the low dielectric constant film 50, depending on each processing.

Figure 8:
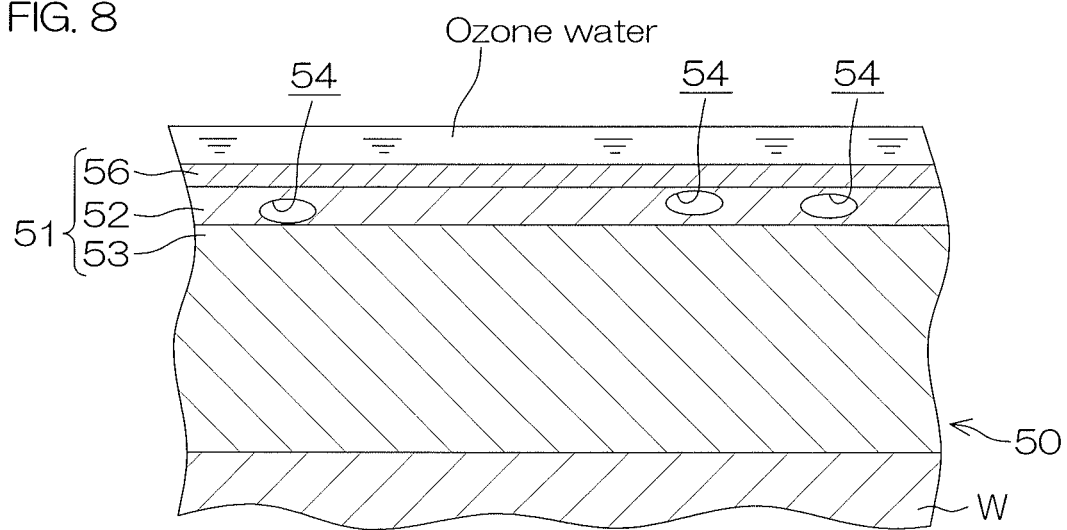
FIG. 8 is a schematic sectional view which shows the vicinity of the low dielectric constant film of the substrate where a densified layer is formed at a part of a damaged layer in oxidation processing (S3 in FIG. 4).

Unlike the substrate processing of the present preferred embodiment, as shown in FIG. 8, in the oxidation processing (S3), only the damaged layer 52 may be changed to the densified layer 56 in the surface layer portion 51 of the low dielectric constant film 50. Further, it is not always neces- sary to change the entire damaged layer 52 to the densified layer 56, and part of the damaged layer 52 may be changed to the densified layer 56.

Figure 9:
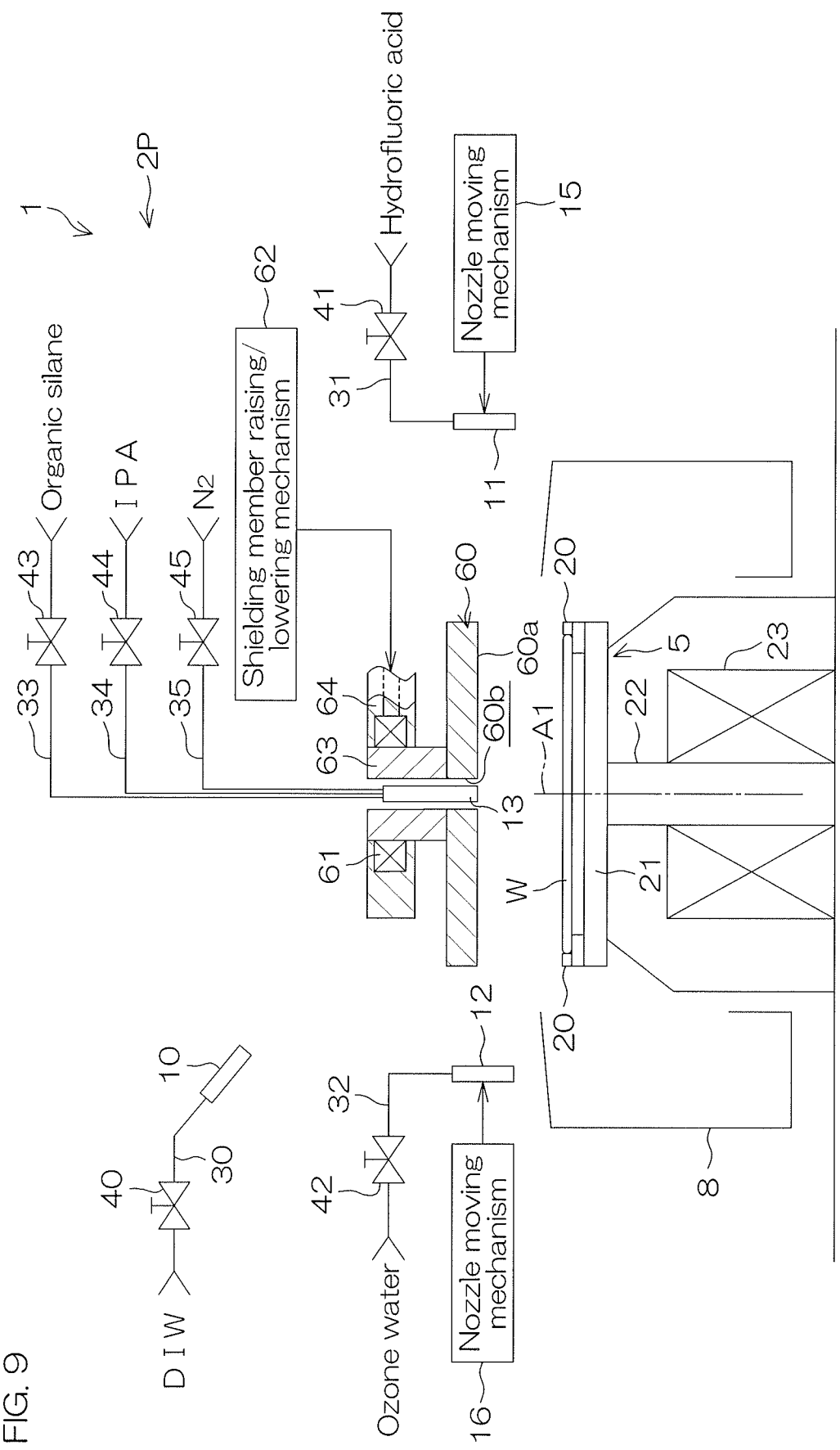
FIG. 9 is an illustrative longitudinal sectional view for describing another configuration example of the processing unit in the first preferred embodiment.

FIG. 9 is an illustrative longitudinal sectional view for describing a processing unit 2P different in configuration from the processing unit 2 (refer to FIG. 2) of the first preferred embodiment. In FIG. 9, the same members as those so far described are given the same reference numerals, with a description thereof omitted. The above-configured processing unit 2P includes a shielding member 60 which has a facing surface 60a that faces an upper surface of a substrate W, a shielding member rotating mechanism 61 which rotates the shielding member 60 and a shielding member raising/lowering mechanism 62 which raises and lowers the shielding member 60.

The shielding member 60 is formed in a disk shape having a diameter substantially equal to or larger than that of a substrate W. A hollow shaft 63 is fixed to a surface of the shielding member 60 on a side opposite to a facing surface 60a. On the shielding member 60, a through hole 60b which penetrates through the shielding member 60 up and down and is communicatively connected with an internal space of the hollow shaft 63 is formed. The shielding member raising/lowering mechanism 62 is coupled to the shielding member 60 by a supporting member 64 which supports the shielding member 60 via the hollow shaft 63. The shielding member rotating mechanism 61 includes an electric motor which is housed internally at a leading end of the supporting member 64. The shielding member raising/lowering mechanism 62 and the shielding member rotating mechanism 61 are controlled by a controller 3 (refer to FIG. 3). In the present preferred embodiment, a nozzle 13 of the processing unit 2P is inserted through an internal space of the hollow shaft 63 and the through hole 60b of the shielding member 60.

The substrate processing apparatus 1 having the processing unit 2P configured in this example is also able to execute substrate processing similar to that described in FIG. 4.

Second Preferred Embodiment

Figure 10:
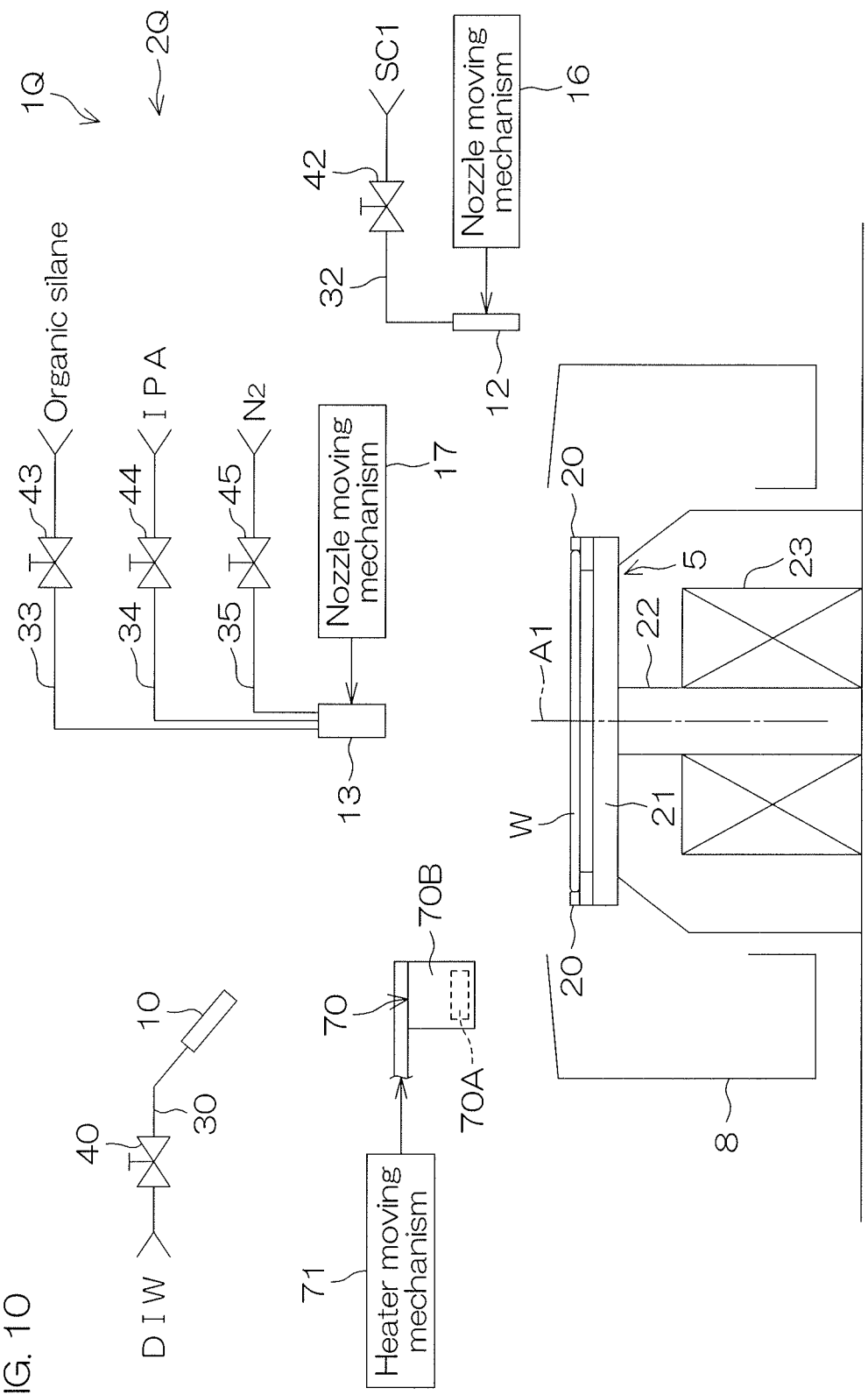
FIG. 10 is an illustrative longitudinal sectional view for describing a configuration example of a processing unit of a substrate processing apparatus according to a second preferred embodiment.

FIG. 10 is an illustrative longitudinal sectional view for describing a configuration example of a processing unit 2Q of a substrate processing apparatus 1Q according to a second preferred embodiment. In FIG. 10, the same members as those described so far are given the same reference numerals, with a description thereof omitted.

The processing unit 2Q is different from the processing unit 2 (refer to FIG. 2) of the first preferred embodiment in that the processing unit 2Q includes an infrared heater 70 for heating an oxidizing agent supplied to an upper surface of a substrate W in place of the first nozzle 11.

The infrared heater 70 includes an infrared lamp 70A which emits infrared rays and a lamp housing 70B which houses the infrared lamp 70A. The infrared lamp 70A is disposed inside the lamp housing 70B. The infrared lamp 70A includes, for example, a filament and a silica tube which houses the filament.

The infrared heater 70 is moved by a heater moving mechanism 71 in a horizontal direction and in a vertical direction. The infrared heater 70 is able to move between a center position and a home position (retracted position) in the horizontal direction. When the infrared heater 70 is positioned at the center position, an irradiation region of infrared rays which faces an upper surface of a substrate W is positioned at a central region including a rotational center of the upper surface of the substrate W. The infrared heater 70 does not face the upper surface of the substrate W when being positioned at the home position. The infrared heater 70 and the heater moving mechanism 71 are controlled by a controller 3 (refer to FIG. 3).

Unlike the substrate processing of the first preferred embodiment, the cleaning processing (S2 in FIG. 4) is not executed in the substrate processing by the substrate processing apparatus 1Q according to the second preferred embodiment.

In the oxidation processing (S3 in FIG. 4), the controller 3 controls a second nozzle moving mechanism 16 to dispose a second nozzle 12 at a processing position above the substrate W. When the second nozzle 12 is positioned at the processing position, an oxidizing agent such as SC1 discharged from the second nozzle 12 may be supplied to a rotational center of the upper surface of the substrate W. Then, the controller 3 opens an oxidizing agent valve 42. Thereby, the oxidizing agent such as SC1 is supplied from the second nozzle 12 to the upper surface of the substrate W (oxidizing agent supplying step). The oxidizing agent discharged from the second nozzle 12 is placed on the upper surface of the substrate W and, thereafter, flows radially outward along the upper surface of the substrate W due to a centrifugal force. The controller 3 may control the heater moving mechanism 71 to move the infrared heater 70 from the retracted position to the processing position, thereby heating the oxidizing agent on the upper surface of the substrate W by using the infrared heater 70.

In the oxidation processing by SC1, SC1 is supplied to a front surface of a low dielectric constant film 50 to remove polymer residues 55 (refer to FIG. 5A), thereby cleaning the front surface of the low dielectric constant film 50. Simultaneously, a surface layer portion 51 of the low dielectric constant film 50 is oxidized and changed to a densified layer 56 (a cleaning step, a densification step, a densified layer forming step). That is, the cleaning step and the densification step are executed at the same time.

According to the second preferred embodiment, the same effect as that of the first preferred embodiment can be obtained.

A series of steps from a substrate carry-in (S1) to a substrate carry-out (S7) shown in FIG. 4 may be executed at an atmospheric pressure.

The present invention shall not be limited to the embodiments so far described but may be carried out in other modes.

For example, in the substrate processing shown in the above-described embodiment, the repair liquid is supplied in the repair liquid supplying step of the repair processing (S4). However, unlike the substrate processing shown in the above-described embodiment, a liquid in which a repair liquid and an organic solvent are mixed may be supplied to a substrate Win a repair liquid supplying step of repair processing (S4).

Further, in the above-described embodiment, the first nozzle 11 functions as a cleaning liquid supply means, the second nozzle 12 functions as an oxidizing agent supply means, and the third nozzle 13 functions as a repair liquid supply means. However, the functions of the individual nozzles 11 to 13 may be different from those of the above-described embodiment. For example, in the first preferred embodiment, the function of each of the cleaning liquid supply means, the repair liquid supply means and the oxidizing agent supply means may be provided with anyone of the nozzles 11 to 13. Further, any one of the nozzles 11 to 13 may be disposed and the nozzle concerned may function as the cleaning liquid supply means, the repair liquid supply means or the oxidizing agent supply means.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

This application claims the benefit of priority to Japanese Patent Application No. 2016-187250 filed on Sep. 26, 2016. The entire contents of this application are hereby incorporated herein by reference.

REFERENCE SIGNS LIST

50: Low dielectric constant film
51: Surface layer portion
52: Damaged layer
53: Non-damaged layer (a part adjacent to the damaged layer in the surface layer portion of the low dielectric constant film)
54: Pore
56: Densified layer
W: Substrate

What is claimed is:
1. A substrate processing method for processing a substrate in which a low dielectric constant film is formed on a surface thereof, the substrate processing method comprising:
    a densification step of densifying a damaged layer, which is presented in a surface layer portion of the low dielectric constant film and in which a plurality of pores are formed, to change the damaged layer to a densified layer, by supplying an oxidizing agent in a liquid state to a surface of the low dielectric constant film, so that the oxidizing agent in the liquid state permeates into the surface layer portion of the low dielectric constant film; and
    a repair liquid supplying step of supplying a repair liquid, for repairing damage of the densified layer, to the surface of the low dielectric constant film after the densification step, so that the repair liquid permeates into the densified layer,
    wherein the repair liquid supplying step includes a liquid replacing step of replacing a liquid on the surface of the low dielectric constant film with the repair liquid.
2. The substrate processing method according to claim 1, wherein the densification step includes a step of forming the densified layer into which the repair liquid is less likely to permeate as compared with the damaged layer.
3. The substrate processing method according to claim 1, wherein the densification step includes a step of compressing the damaged layer to make the plurality of pores smaller, thereby changing the damaged layer to the densified layer.
4. The substrate processing method according to claim 1, further comprising: a cleaning step of supplying a cleaning liquid to the surface of the low dielectric constant film before the densifying agent supplying step, thereby cleaning the surface of the low dielectric constant film.
5. The substrate processing method according to claim 3, wherein the densification step includes a step in which two methyl groups are each removed from corresponding silicon atoms to form a siloxane bond, so that the plurality of pores are made smaller.
6. The substrate processing method according to claim 1, wherein the densification step includes a step of changing a non-damaged layer adjacent to the damaged layer in the surface layer portion of the low dielectric constant film to the densified layer.

7. The substrate processing method according to claim 1, wherein the densified layer has a porosity of 0% to 10% and the thickness of 1 nm to 5 nm.

* * * * *